US006643376B1

(12) United States Patent
Ackerman et al.

(10) Patent No.: US 6,643,376 B1
(45) Date of Patent: Nov. 4, 2003

(54) METHOD AND APPARATUS FOR INDIVIDUAL CONTROL OF AUDIO TO LOUDSPEAKERS LOCATED FROM A CENTRAL CONTROL

(76) Inventors: Mark S. Ackerman, 1470 Vaquero Dr., Simi Valley, CA (US) 93065; Peter A. Madnick, 7960 Pearl St., Ventura, CA (US) 93004; Richard L. Liddell, 627 Valley Oak La., Thousand Oaks, CA (US) 91320

( * ) Notice: Subject to any disclaimer, the term of this patent is extended or adjusted under 35 U.S.C. 154(b) by 0 days.

(21) Appl. No.: 09/305,015

(22) Filed: May 4, 1999

(51) Int. Cl.[7] .......................... H04R 29/00; H04R 27/00; H04R 5/02; H04B 3/00; H03G 3/00

(52) U.S. Cl. .............................. 381/56; 381/77; 381/85; 381/104; 381/300

(58) Field of Search ............................ 381/56–59, 300, 381/77, 81, 85, 104, 107; 379/102.01, 102.03, 101.01

(56) References Cited

U.S. PATENT DOCUMENTS 5,577,128 A * 11/1996 Farinelli, Jr. ................. 381/81
5,751,818 A * 5/1998 Gertz et al. .................... 381/55
6,026,150 A * 2/2000 Frank et al. ............. 379/90.01
6,370,254 B1 * 4/2002 Gore et al. .................. 381/104
6,389,139 B1 * 5/2002 Curtis et al. ................ 381/105

* cited by examiner

*Primary Examiner*—Forester W. Isen
*Assistant Examiner*—Laura A. Grier
(74) *Attorney, Agent, or Firm*—Jack C. Munro

(57) ABSTRACT

In a home or business where there is a central sound source for a stereo and one or more sets of loudspeakers which are located remote as in different rooms from the sound source. A volume control switch is mounted in conjunction with each set of loudspeakers. Within the transmission line between the sound source and each set of loudspeakers there is included a sense signal which is located at a high frequency which is beyond the range of human hearing therefore not to be heard by any human. This sense signal is compared to the audio signal from which the position of the volume control for each set of loudspeakers can be ascertained. Upon initial activation of the sound source, sound is not emitted from the remote loudspeakers upon making a memory change in the volume control for a set of loudspeakers, sound will be immediately emitted from that set of loudspeakers and only that set.

12 Claims, 4 Drawing Sheets

METHOD AND APPARATUS FOR INDIVIDUAL CONTROL OF AUDIO TO LOUDSPEAKERS LOCATED FROM A CENTRAL CONTROL

BACKGROUND OF THE INVENTION

1) Field of the Invention

The field of this invention relates to sound systems and specifically to a sound system that is installed within a home or business where the sound system operates multiple sets of loudspeakers which are located in different rooms of the home or business.

2) Description of the Prior Art

There is a trend of people longing to have music enjoyed in multiple rooms of their home or place of business. The conventional way to install such a stereo system or a radio within a home or business is to have one sound source (receiver, amplifier, CD player, tape deck, and so forth) in a central location of a house or place of business. Wires are then run to different sets of loudspeakers located within each room. A problem then occurs that the amplifier from the sound source cannot safely power all of the loudspeakers simultaneously unless such are connected in a certain pattern which changes depending upon the number of loudspeakers used. A manual loudspeaker selector can solve the problem with this being located at the central source which provides on and off selection for the loudspeakers within the rooms desired. For example, if the user wants the bedroom in an off position but the family room speakers on, such can be selected at the central source. The drawback to this type of an arrangement is that the selector is located at the central equipment location thus forcing the user to leave the room in which the operation or deactivation of the loudspeakers is desired.

Another problem is that if the loudspeakers are too loud in one room and not loud enough in another room, there is no way to change the volume levels in each room independently. A product exists similar to a manual speaker selector with this product again being located at the central location. This product adds volume control for each set of loudspeakers. This, too, has a disadvantage in that the user needs to make the change at the central location to adjust the volume of a particular set of speakers within a particular room. Also, the user has to speculate as to exactly what level the speakers are to be turned on to in a particular room since the user is not located within that room. Frequently, a user will turn on the speakers thinking that the desired level has been obtained. When the user then goes into the specific room the user now knows that the loudspeakers are either too loud or they are too low which requires the user to go back and readjust the volume at the central location.

The most commonly used method an apparatus to solve the volume problem with different sets of loudspeakers within different rooms is installation of volume controls within each room which are wired in line with the loudspeaker wires that run into that room. Now, volume control is independent, but there is no way to turn on the equipment, choose between sound sources, or make changes to the sound source (such as a CD player, radio station or tape player) without returning to the central sound source location. There are ways to solve this problem of controls within each room. However, these ways are exceedingly expensive and also require a significant amount of added equipment plus the running of additional wiring to each room from the central source to provide the control functions.

SUMMARY OF THE INVENTION

The structure of the present invention relates to a circuit installed between remote sets of loudspeakers and a central sound source. This circuit constantly monitors the position of the volume control of each set of loudspeakers in each room, and when a change is noted, it activates appropriate switches and safely turns on the appropriate set of loudspeakers. The primary advantage of the present invention is that it uses existing wiring. Only the equipment at the central source and at the loudspeaker sets needs to change. A track or station selection can be added with only equipment changes at the central source and the remote sets of loudspeakers not requiring the addition of any wiring. The added circuit utilizes a high frequency (out of the range of human hearing) sense signal that is added to the audio that feeds the volume control of each loudspeaker set. Using a sense resistor to create a voltage divider with the volume control, the amplitude of the sense signal can be measured and from that deduce the position of the volume control for each particular set of loudspeakers. High pass and low pass filter circuits are used to isolate the audio amplifier and the sense signal generator from each other. The low pass filter circuit is designed to be able to handle the same power level as the volume control from the central sound source. There is utilized a peak detector circuit which will convert the high frequency sense signal to a DC signal. This DC signal can be amplified. A processor will determine if a level change has occurred which indicates the volume control for a particular set of loudspeakers has been moved. By measuring the level, we can determine the switch position relative to a maximum and a minimum position. This determining of the switch position can be accomplished by digital or analog means. A digital processor has the advantage of easy calibrating the levels so the loads of different sets of loudspeakers can be compensated accordingly. A digital processor can also cause activation or deactivation of the audio to the particular set of loudspeakers.

DETAILED DESCRIPTION OF THE PREFERRED EMBODIMENT

Figure 1:
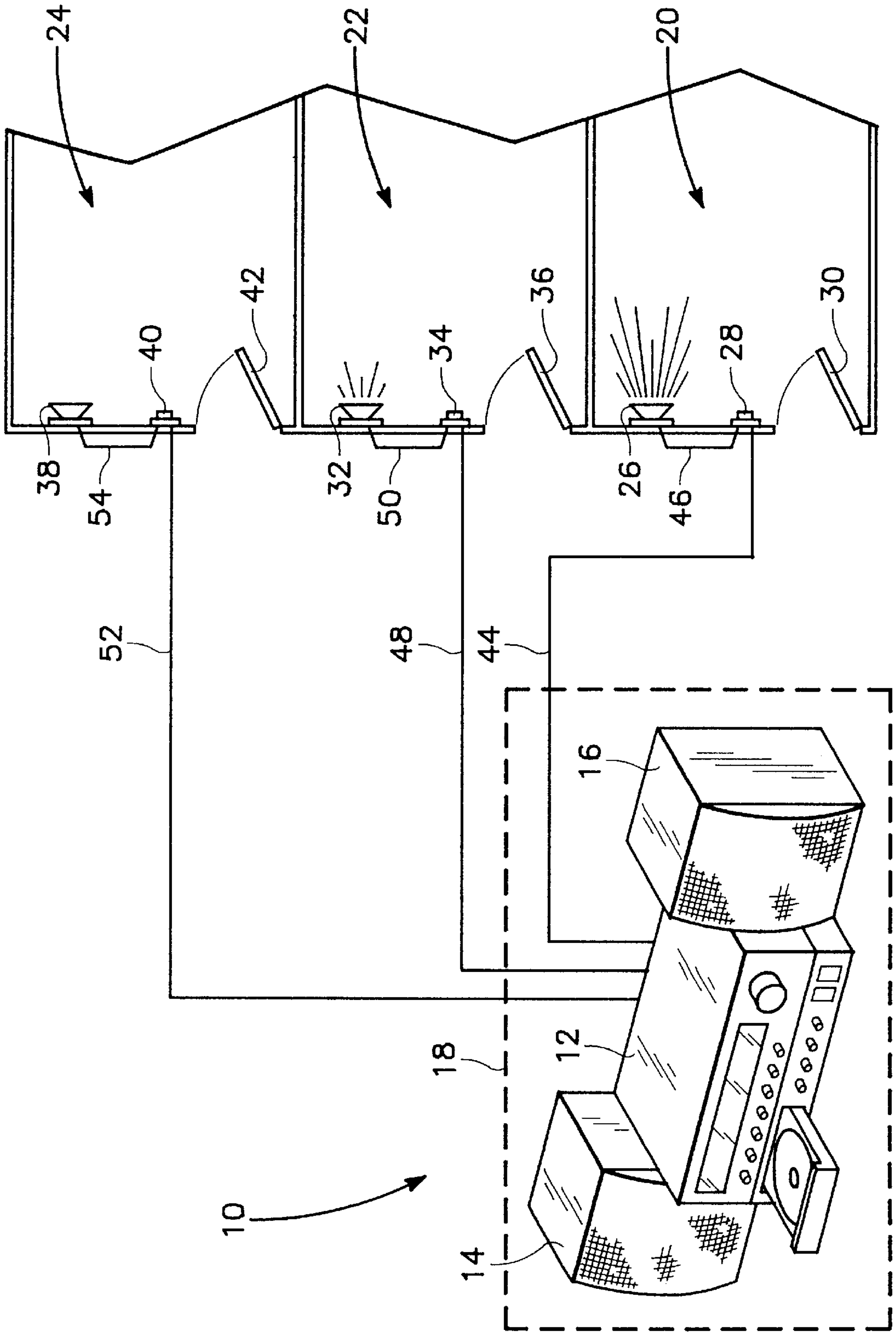
FIG. 1 shows a diagrammatic view of a typical stereo system as a sound source that might be installed within a home or building.

Referring particularly to the drawings, there is shown a sound source 10 in the form of a conventional stereo system. The sound source 10 includes a receiver 12 and a pair of loudspeakers 14 and 16. Sound source 10 is to be located at a central location 18 such as within a family room of a house. Let it be assumed that this house has other rooms such as rooms 20, 22 and 24. Mounted within the room 20 is a loudspeaker 26 which is operated through a button control 28. Access into the room 20 is accomplished by means of a door 30. In a similar manner, the room 22 has a loudspeaker 32 which is operated by means of a button control 34. Access into the room 22 is provided by means of a door 36. Still in a similar manner, the room 24 has a loudspeaker 38 which is operated through a button control 40. A door 42 provides access to the interior of the room 24. A transmission line in the form of an electrical wire assembly 44 connects between the receiver 12 and the button control 28. A separate electrical wire assembly 46 connects between the button control 28 and the loudspeaker 26. A transmission line in the form of an electrical wire assembly 48 connects between the receiver 12 and the button control 34. A separate electrical wire 50 connects between the button control 34 and the loudspeaker 32. A transmission line in the form of an electrical wire assembly 52 connects between the receiver 12 and the button control 40. A separate electrical wire 54 connects between the button control 40 and the loudspeaker 38. Manual turning of a button control 28 will cause the sound volume of loudspeaker 26 to change. Manual turning of button control 34 will cause change in the sound volume to loudspeaker 32. Manual turning of button control 40 will cause the sound volume to change to loudspeaker 38. It is to be understood that normally the loudspeakers 26, 32 and 38 will each comprise a set of speakers, not just one.

Typically, prior to the present invention, the user would turn on the receiver 12 producing a sound from the loudspeakers 14 and 16. The sound would be set by the user to the desired level by listening to the sound that is produced from the loudspeakers 14 and 16. This same level of sound would then be transmitted to each of the loudspeakers 26, 32, and 38. If a volume control button, such as buttons 28, 34 and 40, were included within each of the rooms 20, 22 and 24, the sound level within each of the rooms could be varied and could be different from that which is produced from loudspeakers 14 and 16. However, there would be no way to ever turn off completely the sound that is being supplied to the loudspeakers 26, 32 and 38 unless the receiver 12 was actually turned to an off position. The circuit of the sense signal shown in FIGS. 2–6 will actually be mounted in conjunction with the receiver 12 and also in conjunction with the control buttons 28, 34 and 40. This sense signal is to be conducted through the transmission lines 44, 48 and 52.

Let is be assumed the receiver 12 is activated but sound is not being emitted from any of the loudspeakers 14, 16, 32 or 38. Let it further be assumed that a person desires to have sound within room 24. The person only needs to move button control 40 which will cause sound to be emitted from loudspeaker 38. The volume level of the sound can be adjusted in the normal manner by varying the position of button control 40.

Figure 5:
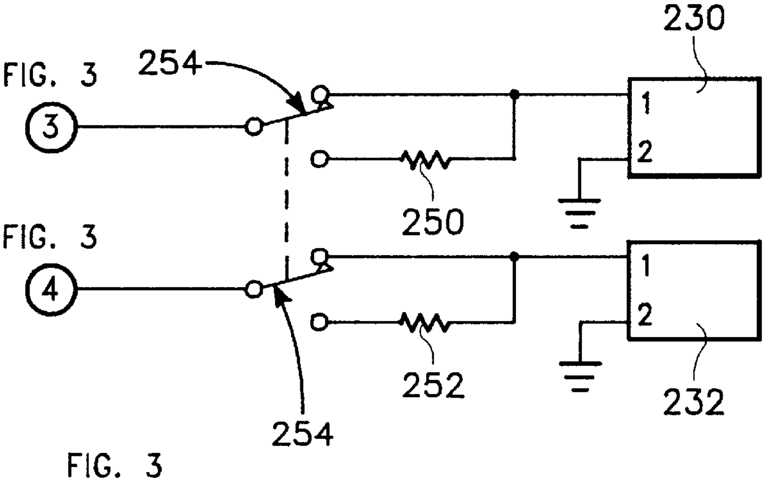
FIG. 5 is an electrical schematic for an "amp load protection circuit" that is included within the overall sense circuit of the present invention.
Figure 6:
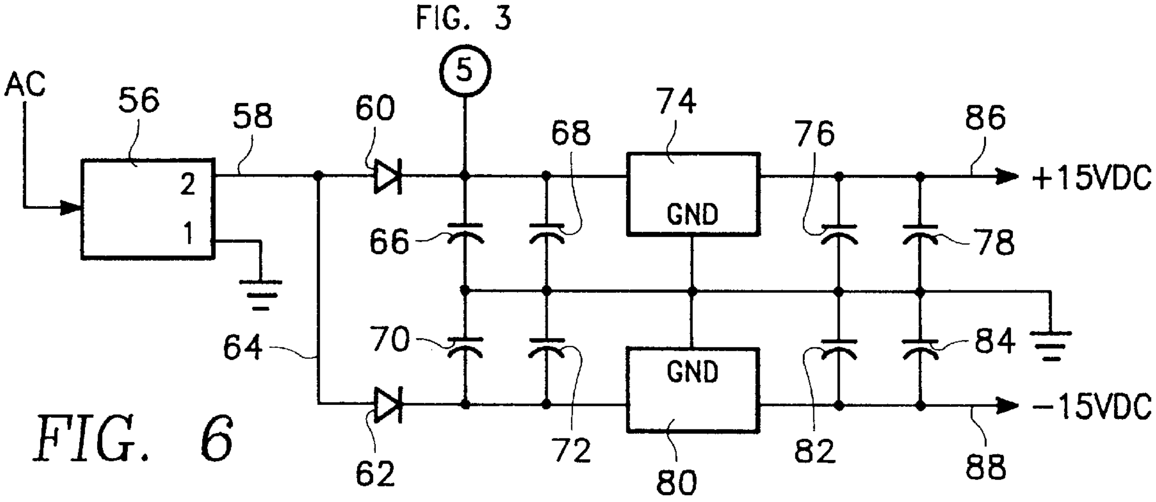
FIG. 6 is an electrical schematic of a "power supply circuit" that is included within the overall sense signal of the present invention.

Referring particularly to FIG. 6, there is shown a "power supply circuit" where an external AC (alternating current) source is supplied to an AC wall transformer 56. This AC wall transformer 56 steps down the 120 V AC voltage RMS (root means squared) from a conventional wall socket of a house or building to 13 V AC RMS that is applied a line 58. Diode 60 halfwave rectifies the AC to provide a positive DC voltage. The diode 62, mounted in line 64 which connects to line 68, halfwave rectifies the AC to provide a negative DC voltage within line 64. Capacitors 66 and 68 filter out any residual AC voltage from the positive DC supplied to diode 60. Capacitors 70 and 72 filter out any residual AC voltage from the negative DC voltage supplied to diode 62. Regulator 74 regulates the positive DC voltage to a constant positive 15 volts DC. Capacitors 76 and 78 further filter out any AC voltage from the regulated positive 15 V DC. Regulator 80 regulates the negative DC voltage to a constant negative 15 V DC. Capacitors 82 and 84 further filter out any AC voltage from the negative 15 V DC. The positive 15 V DC at junction 86 and the negative 15 V DC at junction 88 are used to power the rest of the sense circuit shown in FIGS. 2–5. Typically, the capacitors 66, 76, 70 and 82 could have a value of 0.1 $\mu$f (microfarad). Capacitors 68 and 72 could each have a value of 1000 $\mu$f. The capacitors 78 and 84 could each have a value of 220 $\mu$f.

Figure 4:
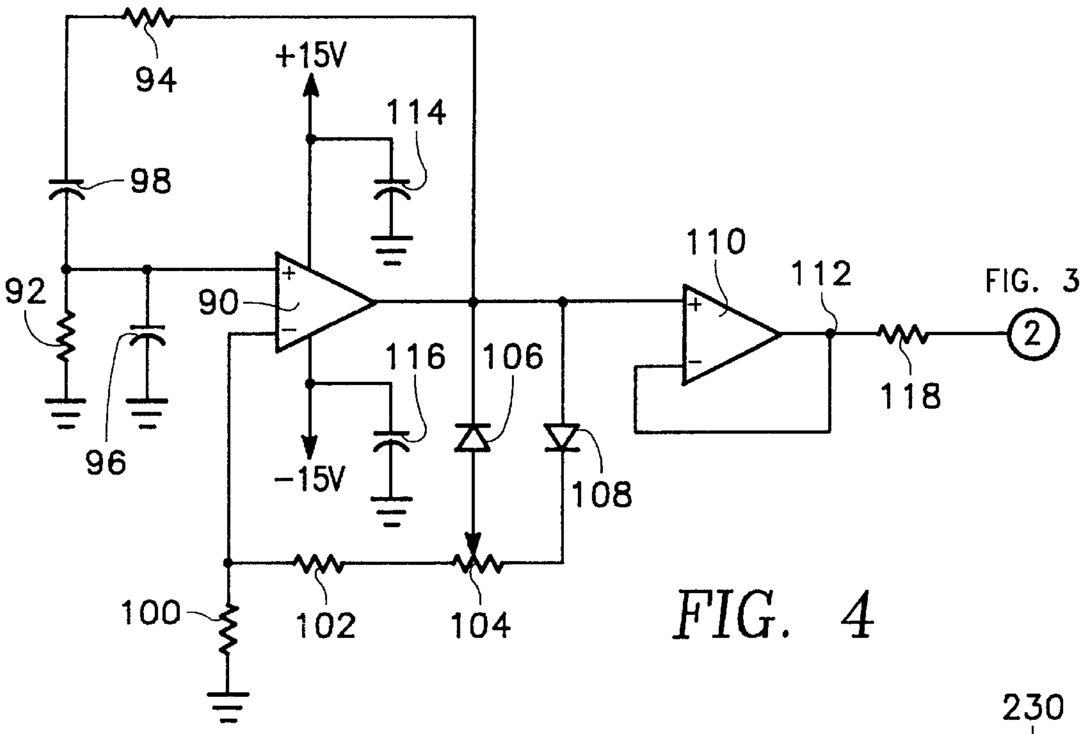
FIG. 4 is an electrical schematic of the "100 kilohertz generator circuit" that is utilized within the overall circuit of the sense signal of the present invention.

The +15 V and −15 V are supplied to an op amplifier 90 of the "100 KHz sense signal generator circuit" that is shown in FIG. 4. The circuit used to provide the 100 KHz sense signal is of a Wien-bridge oscillator design. Resistors 92, 94 and capacitors 96 and 98 provide a positive feedback path for the op amp 90 causing the op amp 90 to oscillate at 100 KHz. Resistors 100 and 102 provide negative feedback to set the amplitude of 100 KHz oscillations of the op amp 90. Variable resistor 104 is used to adjust the amplitude of the 100 KHz oscillations. Diodes 106 and 108 provide automatic gain control to maintain the oscillations at the desired amplitude. Op amp 110 is a unity gain voltage follower used to buffer the 100 KHz oscillations of op amp 90 from change due to circuit loading. The output of the 100 KHz sense signal generator is at junction 112 of the op amp 110. Capacitors 114 and 116 comprise filtering capacitors. Resistor 118 protects the output of the op amp 110 from excessive current and supplies 100 KHz sense signal to the loudspeaker output connector 120. Typical values for the capacitors 92 and 94 would be 370 Pf (picofarads). Typical values for the capacitors 114 and 116 would be 0.1 $\mu$f. Typical values for the resistors 100 and 102 would be 4.99 KΩ (kilo-ohm). Typical value for the variable resistor 104 would be 3.68 KΩ, and typical value for the resistor 118 would 4.75 KΩ.

Figure 3:
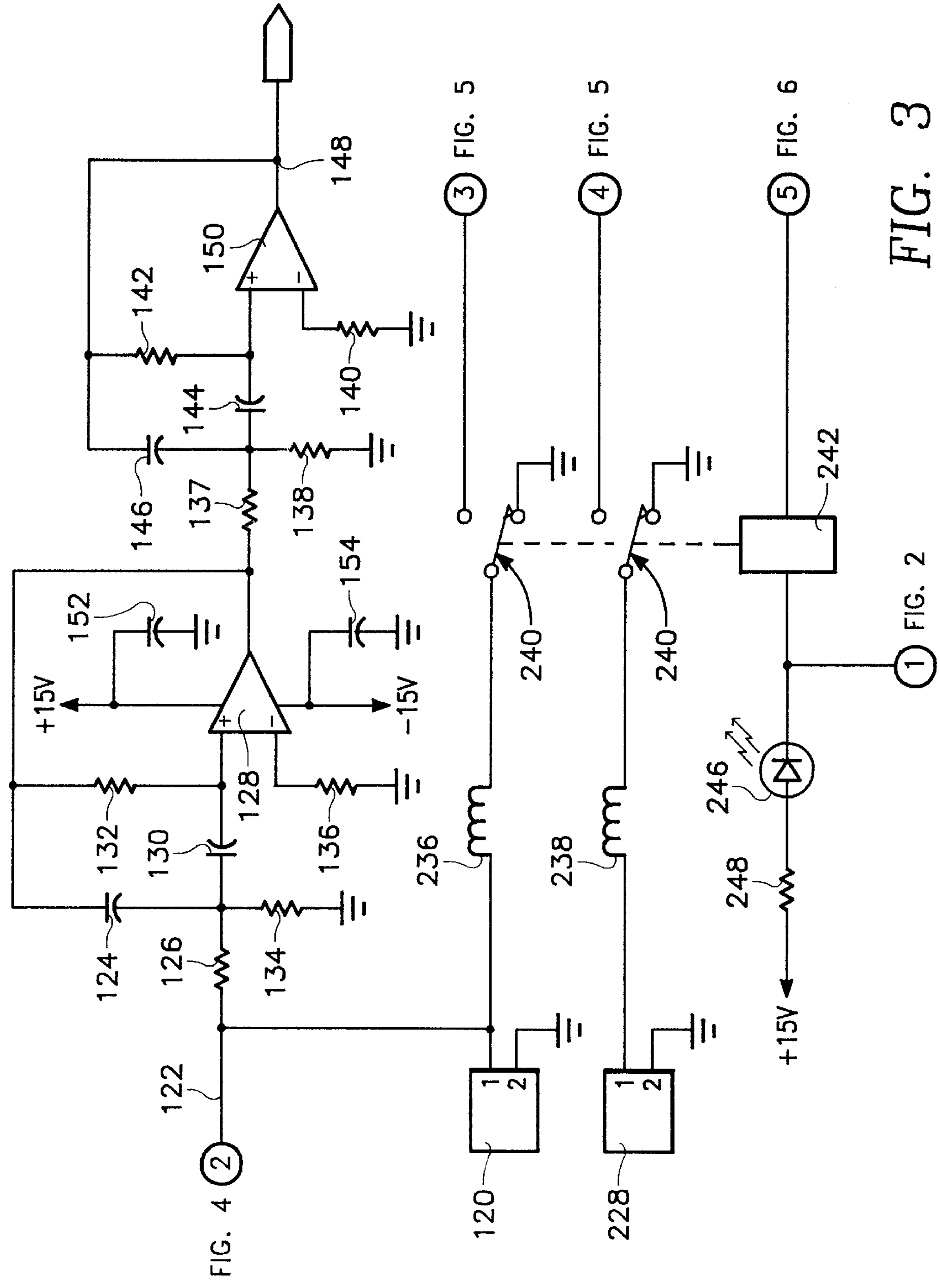
FIG. 3 is an electrical schematic of the "100 kilohertz fourth order band pass circuit" that is utilized within the overall circuit of the sense signal of the present invention.

The output from junction 112 is supplied to a fourth order bandpass filter circuit which is of a multiple-feedback bandpass design and, as shown in FIG. 3, is to provide a second order filter response. Two identical second order filters are cascaded to provide an overall fourth order filter response. The output of the generator from junction 112 is supplied into line 122 of FIG. 3. Capacitor 124 and resistor 126 provide negative feedback to op amp 128 for the low pass response. Capacitor 130 and resistor 132 provide negative feedback to the op amp 128 for the high pass response. Resistor 134 sets the gain in the pass-band for the op amp 128. Resistor 136 provides compensation to minimize the DC offset generated by op amp 128. Resistors 137, 138, 140 and 142 along with capacitors 144 and 146 form an identical circuit to that described previously in this paragraph. The input to the fourth order bandpass filter is applied to resistor 126 from the loudspeaker output connector 120. The output from the fourth order bandpass filter is at junction 148 of op amp 150. Capacitors 152 and 154 are filtering capacitors for the op amp 128.

Figure 2:
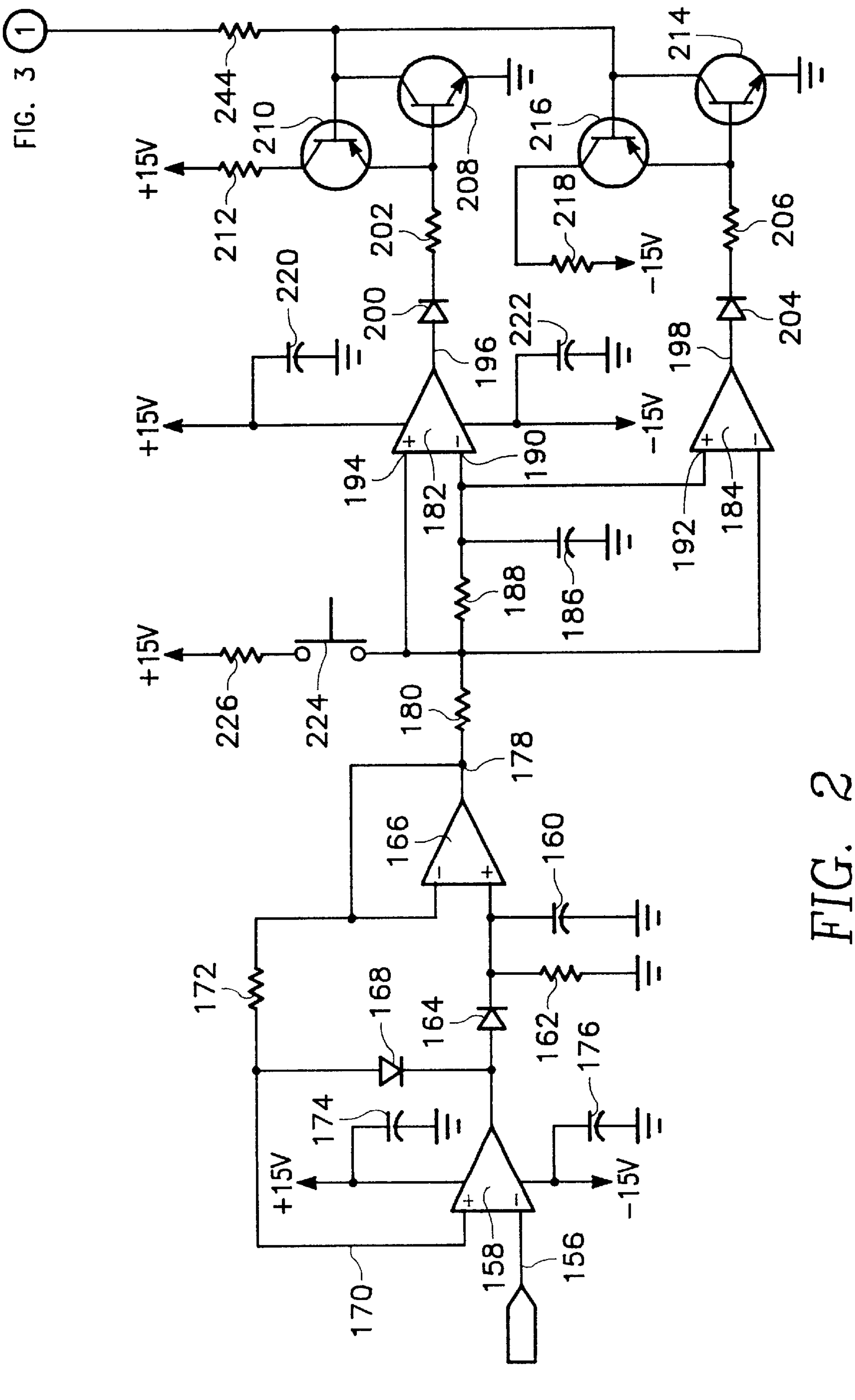
FIG. 2 is an electrical schematic diagram of a "peak detector circuit" and an "on comparators with latch circuit" that is used in producing the sense signal of the present invention.

The input to the "peak detector circuit" shown in FIG. 2 is supplied to line 156. Line 156 connects to op amp 158. Op amp 158 charges capacitor 160 through diode 164 to the peak voltage seen in line 156. Diode 164 prevents capacitor 160 from discharging through op amp 158 when the input voltage in line 156 is lower than the voltage on capacitor 160. Resistor 162 provides a slow discharge path for capacitor 160. Op amp 166 is a unity gain follower to buffer the voltage on capacitor 160 from circuit loading. Diode 168 provides a negative feedback path for op amp 158 when the voltage in line 170 is less than the input voltage in line 156 to prevent saturation of op amp 158. Resistor 172 is a filtering resistor for line 170. Capacitors 174 and 176 are filtering capacitors for the op amp 158. The output for the peak detector, previously described, is supplied to junction 178. Typical values for capacitors 174 and 76 would be 0.1 μf. Typical value for resistor 172 would be 100 KΩ. Typical value for resistor 162 would be 31.1 KΩ. Typical value for capacitor 160 would be 10 μf.

The "on comparators with latch circuit" utilizes resistor 180 which is to provide compensation for the DC offset of op amps 182 and 184. Capacitor 186 charges through resistor 188 to the output voltage level at junction 178 of the peak detector circuit. The long time constant of resistor 180 and capacitor 186 provide a time delay to the inputs of the comparators on pin 190 of op amp 182 and pin 192 of op amp 184. Op amp 182 compares the voltage that is on pin 194 of op amp 182 to the voltage that is on pin 190. When pin 194 has a lower voltage than pin 190, the output voltage within line 196 is −14 v DC. When pin 194 has a higher voltage than pin 190, the output voltage in line 196 is +14 v DC. Op amp 182 provides a positive output voltage within line 196 when the voltage on pin 194 moves in the positive direction and a negative output voltage in line 196 when the voltage on pin 194 moves in a negative direction or when there is no change in voltage level on pin 194. Op amp 184 provides a positive output voltage in line 198 when the voltage on pin 192 moves in a negative direction and a negative output voltage in line 198 when the voltage on pin 192 moves in the positive direction or there is no change in voltage level on pin 192. Diode 200 blocks any negative voltage within line 196 from the op amp 182 and will pass any positive voltage within line 196 onto resistor 202. Diode 204 will block any negative voltage within line 198 from the op amp 184 and pass any positive voltage within line 198 from op amp 184 to resistor 206. Resistor 202 protects the base of transistor 208 from excessive current while providing for the saturation of transistor 208 when positive voltage is applied to resistor 202 from diode 200. Transistor 210 will saturate when transistor 208 saturates and keeps transistor 208 saturated after the positive voltage is removed from resistor 202. Resistor 212 protects transistor 210 from excessive current during saturation. Resistor 206 protects the base of transistor 214 from excessive current while providing for the saturation of transistor 214 when positive voltage is applied to resistor 206. Transistor 216 will saturate when transistor 214 saturates and keeps transistor 214 saturated after positive voltage is removed resistor 206. Resistor 218 protects transistor 216 from excessive current during saturation. Capacitors 220 and 222 are filtering capacitors for the op amp 182. The switch 224, when manually activated, causes 15 V to be applied to pin 194 of op amp 182 which resets the comparator. The resistor 226 is a pull up resistor. Typical values would be as follows: resistor 180, 49.9 K; resistor 302, 10 K; resistor 218, 10 K; capacitors 220, 222 and 186, 0.1 μf; and resistor 206, 10 K.

Referring particularly to FIGS. 3 and 5, there is shown the speaker switch circuit. The speaker output connector 120 is connected to the in-house wiring that goes to the left channel remote speakers. The speaker output connector 228 is connected to the in-house wiring that goes to the right channel remote speakers. Audio amplifier input 230 is connected to the left channel output of the audio amplifier which is located at the receiver 12. The audio amplifier input 232 is connected to the right channel output of the audio amplifier of the receiver 12. Inductors 236 and 238 protect the audio amplifier outputs from the 100 Khz sense signal. Switch 240 connects the speaker outputs of connectors 120 and 228 to the audio amplifier inputs 230 and 232. Switch 240 starts in the "off" state which has the speaker output disconnected from the amplifier inputs and connects inductors 236 and 238 to ground. When transistor 208 or transistor 214 saturates, current flows through the coil 242 of switch 240 which energizes the coil 242 causing the relay to close the switch 240 connecting the speaker outputs 120 and 228 to the audio amplifier inputs 230 and 232. Resistor 244 protects coil 242 from excessive current. Light emitting diode 246 will light to indicate that the audio amplifier input is connected to the speaker output. Resistor 248 protects the light emitting diode 246 from excessive current. Typical values for inductors 236 and 238 are 33 μh.

There is included a "protection circuit" for the audio amplifier within the receiver 12. This protection circuit comprises resistors 250 and 252 which protects the audio amplifier from low loads produced by multiple speaker zones being on at the same time. Switch 254, when manually activated, either activates or deactivates the resistors 250 and 252. Resistor 250 provides protection for the audio amplifier input 230 with resistor 252 providing protection for the audio amplifier input 232. Resistors 250 and 252 have typical values of 3 ohms.

For the speaker arrangement shown in FIG. 1, there will be utilized one power supply circuit, one "100 KHz sense signal generator circuit", four "100 KHz fourth order band pass filter circuits" (one for each speaker zone), four "peak detector circuits" (one for each speaker zone), four "on comparators with latch circuits" (one for each speaker zone), four "speaker switch circuits" (one for each speaker zone), and one "amplifier protection circuit". It is to be understood that a greater or lesser number of loudspeakers could be used with corresponding changes in the circuitry.

What is claimed is:

1. In combination with a sound source and at least one loudspeaker located spaced from said sound source, a transmission means connected between said sound source and said loudspeaker, said transmission means including an audio signal, said loudspeaker having a volume control and an on/off switch that operate through said transmission means, the improvement comprising:

a sense signal is added within said transmission means, said sense signal is compared to a reference signal which can then determine the position of said volume control and upon a change being detected said loudspeaker is activated from a deactivated position with the activation being initiated at the location of said loudspeaker.

2. The combination as defined in claim 1 wherein:

is said sense signal being in the approximate range of 100 kilohertz.

3. The combination as defined in claim 1 further including a peak detector circuit which processes said sense signal.

4. The combination as defined in claim 1 further including an on comparator with latch circuit which processes said sense signal.

5. The method of controlling remote activation of a central stereo system by detecting a change in to a transmission means which transmits an audio signal to a loudspeaker which is located remote from the central stereo system, said loudspeaker having volume control means, said method comprising the steps of:

generating a sense signal within said transmission means; and comparing said sense signal a reference signal and upon noting a change, the audio signal to said loudspeaker is activated with the activation being initiated at the location of said loudspeaker.

6. The method as defined in claim 5 wherein the generating step includes utilizing a generator within the approximate range of 100 kilohertz.

7. The method as defined in claim 5 wherein the generating step includes utilizing a peak detector circuit.

8. The method as defined in claim 5 wherein the generating step includes utilizing an on comparator with latch circuit.

9. In combination with a sound source which has at least one loudspeaker located remote from a central control, said loudspeaker having a volume control, an audio signal to be transmitted on a transmission line from said central control to said loudspeaker, the improvement comprising:

a sense signal being added to said transmission line, said sense signal is compared to a reference signal and a change in the position of said volume control will result in an activation of said audio signal to said loudspeaker with this activation being initiated at the location of said loudspeaker.

10. The combination as defined in claim 9 wherein:

said sense signal is generated by a high frequency generator.

11. The combination as defined in claim 9 wherein:

said sense signal is processed by a peak detector circuit.

12. The combination as defined in claim 9 wherein:

said sense signal is processed by an on comparator with latch circuit.

* * * * *